(12) United States Patent
Tsai et al.

(10) Patent No.: US 8,728,915 B2
(45) Date of Patent: May 20, 2014

(54) WAFER LASER-MAKING METHOD AND DIE FABRICATED USING THE SAME

(75) Inventors: Yu-Pin Tsai, Kaohsiung (TW); Cheng-I Huang, Hunei Township, Kaohsiung County (TW); Yao-Hui Hu, Dashe Township, Kaohsiung County (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 238 days.

(21) Appl. No.: 13/225,756

(22) Filed: Sep. 6, 2011

(65) Prior Publication Data

US 2011/0316122 A1  Dec. 29, 2011

Related U.S. Application Data

(63) Continuation-in-part of application No. 12/482,131, filed on Jun. 10, 2009, now abandoned.

(30) Foreign Application Priority Data

Jul. 3, 2008  (TW) .................................. 97125143 A

(51) Int. Cl.
| | |
|---|---|
| *H01L 21/268* | (2006.01) |
| *H01L 29/06* | (2006.01) |
| *H01L 21/683* | (2006.01) |
| *H01L 23/544* | (2006.01) |
| *H01L 23/00* | (2006.01) |

(52) U.S. Cl.
CPC .......... *H01L 21/6836* (2013.01); *H01L 23/544* (2013.01); *H01L 24/13* (2013.01)

USPC ........... 438/462; 438/463; 438/464; 438/795; 257/E21.347

(58) Field of Classification Search
CPC ... H01L 21/6836; H01L 23/544; H01L 24/13; H01L 2221/68327
USPC .................................. 438/462, 463, 464, 795
See application file for complete search history.

(56) References Cited

U.S. PATENT DOCUMENTS

| | | |
|---|---|---|
| 2004/0082103 A1 | 4/2004 | Feng |
| 2004/0137700 A1 | 7/2004 | Sekiya |
| 2008/0293218 A1 | 11/2008 | Nakamura |

FOREIGN PATENT DOCUMENTS

| | | |
|---|---|---|
| TW | 466652 | 12/2001 |
| TW | 563212 | 11/2003 |
| TW | 200644059 | 12/2006 |
| TW | I282118 | 6/2007 |

*Primary Examiner* — Alexander Ghyka
(74) *Attorney, Agent, or Firm* — Muncy, Geissler, Olds & Lowe, P.C.

(57) ABSTRACT

A wafer laser-marking method is provided. First, a wafer having a first surface (an active surface) and a second surface (a back surface) opposite to each other is provided. Next, the wafer is thinned. Then, the thinned wafer is fixed on a non-UV tape such that the second surface of the wafer is attached to the tape. Finally, the laser marking step is performed, such that a laser light penetrates the non-UV tape and marks a pattern on the second surface of the wafer. According to the laser-marking method of the embodiment, the pattern is formed by the non-UV residuals left on the second surface of the wafer, and the components of the glue residuals at least include elements of silicon and carbon.

11 Claims, 6 Drawing Sheets

WAFER LASER-MAKING METHOD AND DIE FABRICATED USING THE SAME

This application is a continuation-in-part application of application Ser. No. 12/482,131, filed Jun. 10, 2009 now abandoned, which claims the benefit of Taiwan application Serial No. 97125143, filed Jul. 3, 2008, the contents of which are incorporated herein by reference.

BACKGROUND OF THE INVENTION

1. Field of the Invention

The invention relates in general to a wafer laser-marking method and a die manufactured using the same, and more particularly to a laser-marking method capable of precisely marking a desired pattern and a die manufactured using the same.

2. Description of the Related Art

Along with the rapid advance in technology, many electronic products featured by high speed, light weight, slimness and compactness are provided one by one. The main function of the packaging industry is to support the development of electronic products and assure that the speed of semiconductor packages keeps improving and the semiconductor packages function properly. Thus, the electronic products using the semiconductor packages can meet the market requirements of lightweight, slimness and compactness. In order to meet the users' needs, the way of packaging semiconductor packages also keeps being renewed so that the packages become further miniaturized.

Of the many factors that affect the development of the super-thinned package, the thickness of the chip is very crucial. The smaller the chip is, the easier it is to integrate many chips having different functions into one single small-sized package. The step of thinning the wafer is an indispensible step in the making of a small-sized chip. However, the thinner the wafer is, the easier the warpage will occur and affect subsequent process. For example, the laser light cannot precisely mark a pattern on the back surface of the wafer.

Referring to FIG. 1A~FIG. 1D illustrate a conventional wafer laser-marking method. Firstly, a wafer 10 having a first surface (an active surface) 101 and a second surface (a wafer back surface) 103 is provided, wherein a plurality of bumps 12 are disposed on the first surface 101. Typically, the first surface 101 is the active surface (the circuit surface) of the wafer 10, and the second surface 103 is the back surface (the non-circuit surface) of the wafer 10. Next, an adhesive layer 14 is disposed on the first surface 101 of the wafer 10 as indicated in FIG. 1A. The adhesive layer 14 can be any back grinding (BG) tape applicable to the thinned wafer 10. Then, the grinding step is performed to thin the wafer 10 by grinding the second surface 103 of the wafer 10 as indicated in FIG. 1B.

After that, the periphery of the wafer 10 is fixed by a frame 16, then the wafer 10 and the frame 16 are positioned on a supporting structure (not illustrated), and a laser light is radiated on the second surface 103 of the wafer 10 to carve a desired laser marking (pattern), as indicated in FIG. 1C. The generated laser markings could be divided as large marks and white marks. Normally, a depth of large mark is approximately 0.1 µm, and a depth of white mark approximately ranges between 2 µm to 4 µm. Finally, the wafer 10 is singulated to form a plurality of dies 18.

However, as both the frame 16 and the supporting structure are both made of hard materials, warpage might easily occur to the thin wafer due to the gravity. That is, the center of thinned wafer 10 sinks and becomes lower than the two sides. It is very difficult for the laser light to precisely focus on the back surface of the wafer whose periphery has severe problem of warpage. The allowable tolerance of focusing point of the laser light (variation from a standard) is usually about 1 mm. Referring to FIG. 2, a wafer warpage and laser lights are schematically shown. As indicated in FIG. 2, the laser lights L1, L2, L3, L4 can be radiated on the back surface of the wafer to mark a pattern, wherein the laser light L1 corresponds to the center of the wafer. However, for the areas having server warpage (for example, the periphery of the wafer), the focal point of the laser light is not able to reach the back surface of the wafer. Take the laser light Ln for example, there is a distance between the focal point a of the laser light Ln and the back surface of the wafer, the laser light therefore cannot be radiated on the back surface of the wafer to mark a pattern precisely. Thus, the marking on the wafer has defects, not only reducing product yield rate but also increasing manufacturing cost.

SUMMARY OF THE INVENTION

The invention provides a wafer laser-marking method capable of avoiding wafer warpage, such that the laser light can precisely mark a desired pattern on the back surface of the wafer so as to increase product yield rate. Besides, there are glue residuals remained in the laser-marking pattern of the die manufactured according to the laser-marking method of the invention, and the components of the glue residuals at least include elements of silicon and carbon.

According to one embodiment, a wafer laser-marking method is provided. Firstly, a wafer having a first surface and a second surface opposite to each other is provided, wherein the first surface has a plurality of bumps. Next, the second surface of the wafer is thinned. Then, the second surface of the wafer is attached to the non-UV tape. Finally, the laser marking step is performed, such that a laser light penetrates the non-UV tape and forms a pattern on the second surface of the wafer.

According to another embodiment, a silicon die including a first surface and a second surface is provided. The first surface has a plurality of bumps. The second surface is opposite to the first surface. There is pattern formed on the second surface of the wafer, and the pattern formed by the non-UV residuals left on the second surface of the wafer.

Compared with the conventional laser-marking method, the laser-marking method of the embodiment first of all fixes the thinned wafer and makes the wafer flat and free of warpage, such that the laser light is capable of precisely marking a pattern on the back surface of the wafer and increasing product yield rate. Furthermore, in the present embodiment, the dicing tape applicable to the wafer cutting apparatus is used to fix the tape of the thinned wafer, so the subsequent process of cutting the wafer can be performed directly, further effectively simplifying the manufacturing process.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1A:
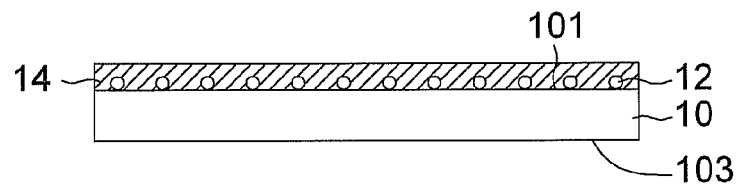
FIG. 1A~FIG. 1D illustrate a conventional wafer laser-marking method.
Figure 1B:
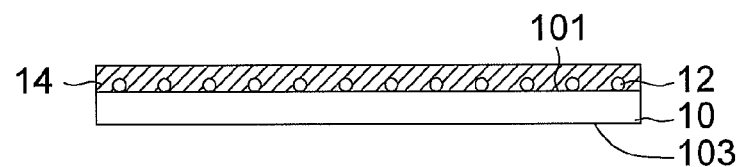
Figure 1C:
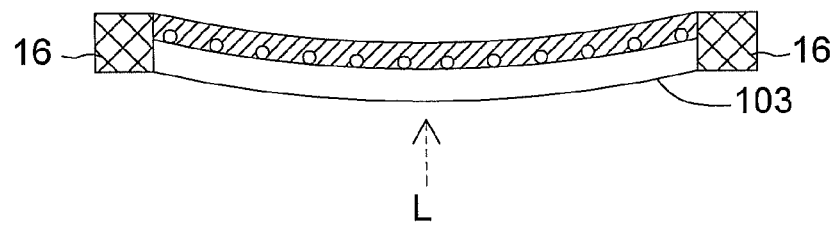
Figure 1D:
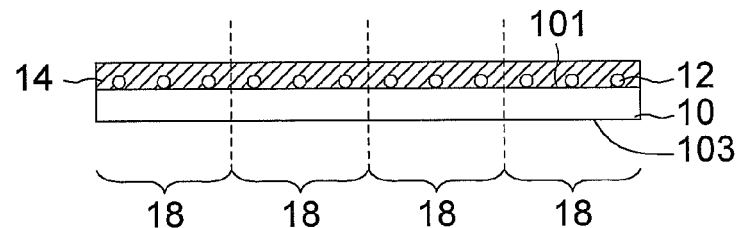
Figure 2:
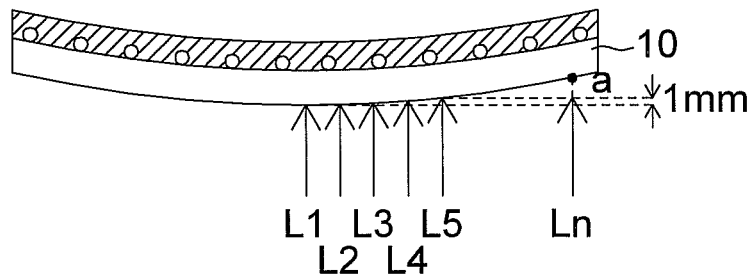
FIG. 2 shows a wafer warpage and laser lights.
Figure 3A:
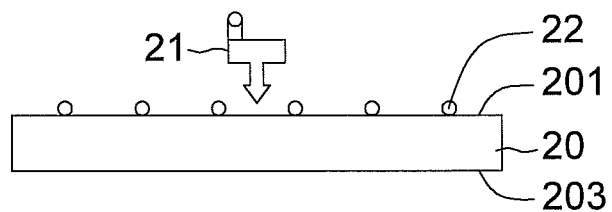
FIG. 3A~FIG. 3G illustrate a wafer laser-marking method according to the embodiment of the invention.

Referring to FIG. 3A, a wafer 20 having a first surface (such as an active surface) 201 and a second surface (such as a wafer back surface) 203 is provided, wherein a plurality of bumps 22 are formed on the first surface 201. A plurality of solder balls could beformed on the first surface 201 as the bumps 22. An inspection device 21 such as a microscope is used for inspecting whether the wafer 20 or the implanted ball has any defects.

Figure 3B:
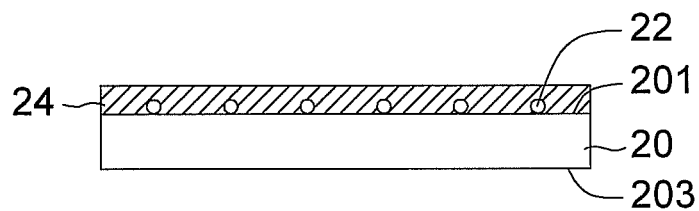

Referring to FIG. 3B, an adhesive layer 24 is disposed on the first surface 201 of the wafer 20. The shape of the adhesive layer 24 is similar to that of the wafer 20 but the size of the adhesive layer 24 is slightly larger than that of the wafer 20. The adhesive layer 24 can be made of any back grinding (BG) tape applicable to the thinned wafer 20. In practical application, a round grinding frame (not illustrated) is used to flatly unfold the periphery of the adhesive layer 24, and then the adhesive layer 24 is attached to the first surface 201 of the wafer 20.

Figure 3C:
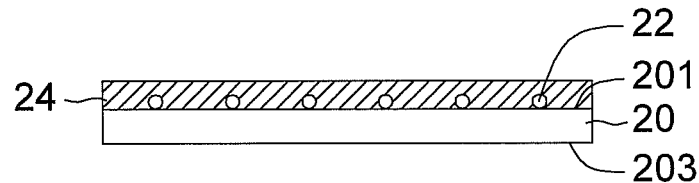

Referring to FIG. 3C, the grinding step is performed on for thinning the wafer 20 by grinding the second surface 203 of the wafer 20. The wafer can be thinned by way of mechanical grinding, chemical-mechanical polishing grinding, wet etching, atmospheric downstream plasma (ADP) or dry chemical etching (DCE). The embodiment does not have further limitations regarding the ways of thinning the wafer 20.

Figure 3D:
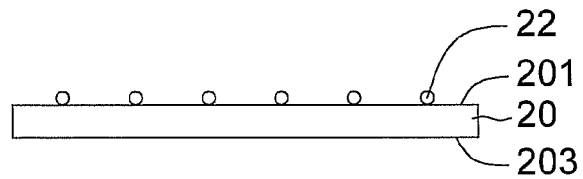

Referring to FIG. 3D, the adhesive layer 24 is removed. The way of removing the adhesive layer 24 is determined according to the characteristics of the adhesive layer. For example, the adhesive layer 24 may lose its adherence when heated at a high temperature or radiated by an ultra-velvet light.

Figure 3E:
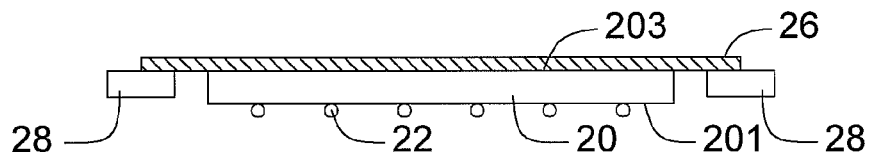

Referring to FIG. 3E, a tape 26 is attached on the second surface 203 of the thinned wafer 20 to fix the wafer 20. In practical application, a frame 28 is provided, and the peripheral of the tape 26 is flatly unfolded on the frame 28 to form a flat surface. Next, the tape 26 is attached on the second surface 203 of the wafer 20. Due to the expansion of the tape 26, the surface of the wafer 20 attached on the tape 26 will remain flat and will be free of warpage.

In the present embodiment, example of the frame 28 is a frame applicable to a laser apparatus (not illustrated) and a wafer cutting apparatus (not illustrated). Example of the tape 26 is a dicing tape applicable to the wafer cutting apparatus.

Figure 3F:
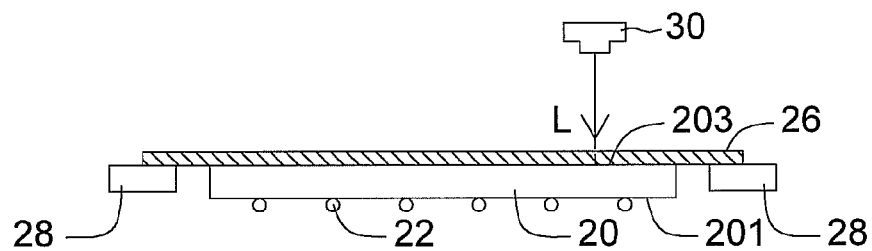

Referring to FIG. 3F, the frame 28 on which the wafer 20 has been fixed is moved to the laser apparatus, and a laser light L is emitted to the second surface 203 of the wafer 20 by a laser-exciting apparatus 30 (disposed at one side of the second surface 203 of the wafer 20) to perform the laser marking step. In practical application, an image device such as a CCD (not illustrated) can be disposed beside the first surface 201 of the wafer 20, and the laser light L can be moved co-axially with the image device to complete the step of laser marking a pattern on the wafer 20. During the laser-marking step, the wafer 20 remains a flat surface and is free of warpage, so that the laser light L is capable of precisely focusing and marking the desired pattern on the back surface of the wafer.

Figure 3G:
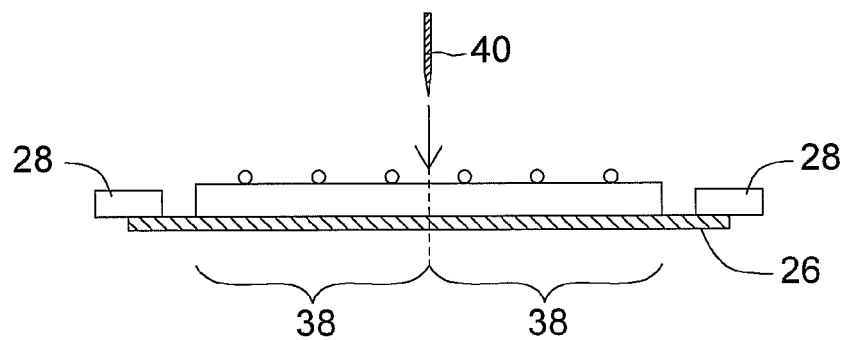

Referring to FIG. 3G, a wafer sawing process is performed. The frame 28 on which the wafer 20 has been fixed is moved to a wafer cutting apparatus (not illustrated), and the first surface 201 of the wafer 20 is cut by a diamond cutter 40 or other cutting tools as indicated in FIG. 3G to divide the wafer 20 into a plurality of dies 38 attached on the tape 26. The sawing performance and workablility of the wafer with marking patterns formed by the method of the embodiment are the same as that the wafer marked by the conventional method. In the embodiment, no water permeation or flying die has been found after the sawing process.

Figure 4A:
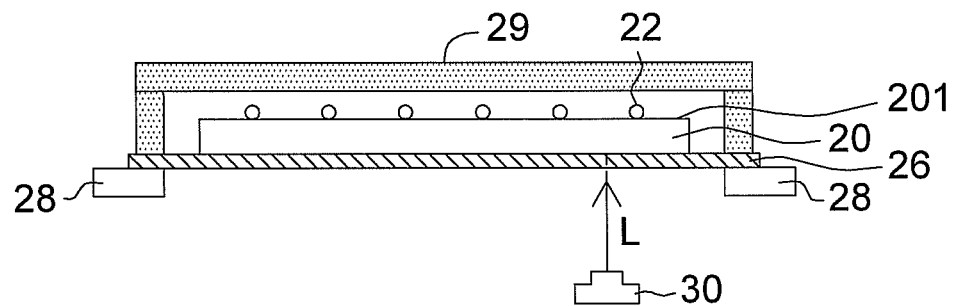
FIG. 4A illustrates another wafer laser-marking method according to the embodiment of the invention.
Figure 4B:
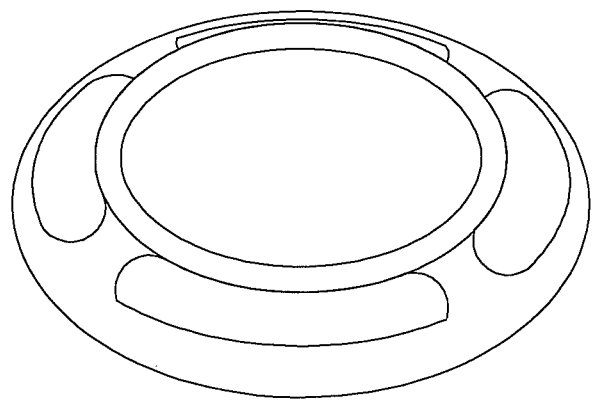
FIG. 4B illustrates one type of the rings applied in the embodiment of the invention.

Referring to 4A, another wafer laser-marking method according to the embodiment of the invention is illustrated. The tape 26 is attached on the second surface 203 of the thinned wafer 20, and the ring 29 is set on the periphery of the tape 26, so that the periphery of the tape 26 is flatly unfolded on the frame 28 to form a flat surface attached to the second surface 203 of the wafer 20. Then, a laser light L is emitted towards the second surface 203 of the wafer 20 by a laser-exciting apparatus 30 to perform the laser marking step. In FIG. 4A, the ring 29 and the frame 28 are positioned on the opposite sides of the tape 26. FIG. 4B illustrates one type of the rings applied in the embodiment of the invention.

According to the laser-marking step of the present embodiment, the laser light L penetrates the tape 26 to form a pattern on the second surface 203 of the wafer 20. And there are two laser-marking types applicable in the embodiment, as indicated in FIG. 5A~FIG. 5B.

Figure 5A:
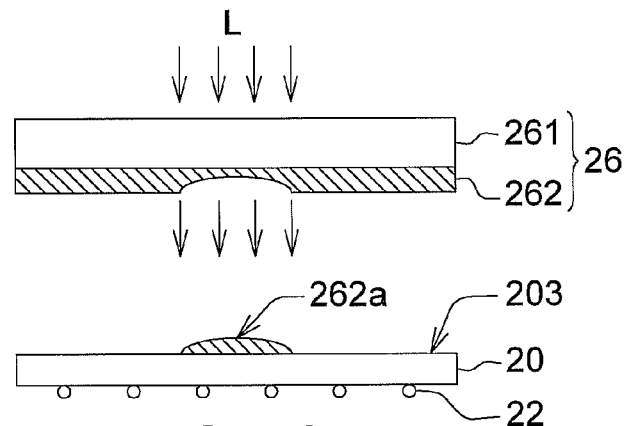
FIG. 5A illustrates one laser-marking type for making the pattern formed by the adhesive residuals according to the embodiment of the invention.

Referring to FIG. 5A, the tape 26 includes a base film 261 and an adhesive layer 262. Examples of the base film of the tape include polyvinyl chloride (PVC) film, polyolefin (PO) and Polyethylene (PE). The one laser-marking type is the laser light focusing on the adhesive layer 262, therefore, the pattern formed by the residuals of the adhesive layer 262 of the tape 26 is projected from the second surface 203 of the wafer 20. According to the embodiment, the components of the residuals remained on the second surface 203 of the wafer 20 at least include elements of silicon and carbon after analysis.

Figure 5B:
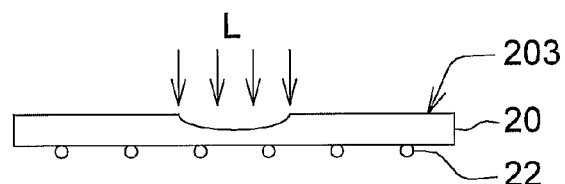
FIG. 5B illustrates another laser-marking type for making the pattern by grooving the wafer according to the embodiment of the invention.

Referring to FIG. 5B, the another type is the laser light focusing on the wafer 20, therefore the pattern is formed by grooving the second surface 203 of the wafer 20, and the indented depth of the laser mark ranges between about 0.1 μm to 4 μm.

Figure 6A:
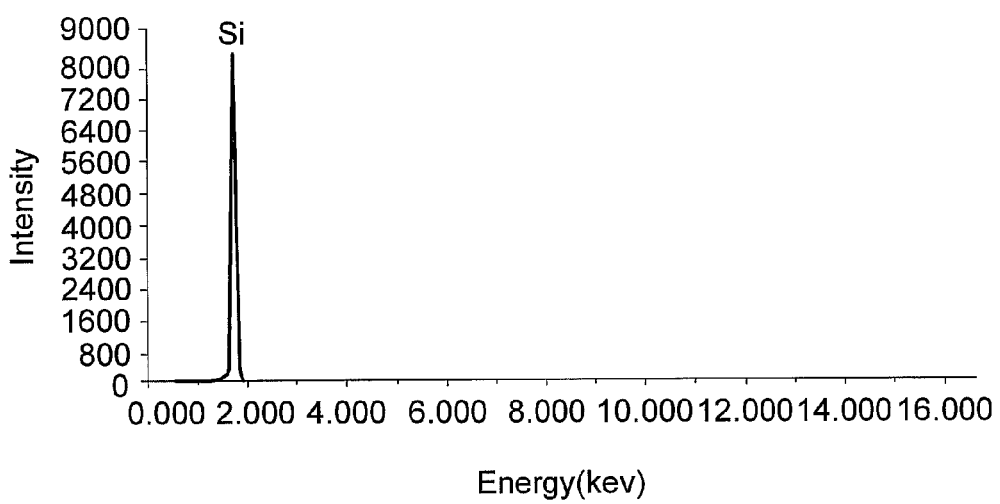
FIG. 6A is the EDX result of the pattern formed by a normal laser marking method.
Figure 6B:
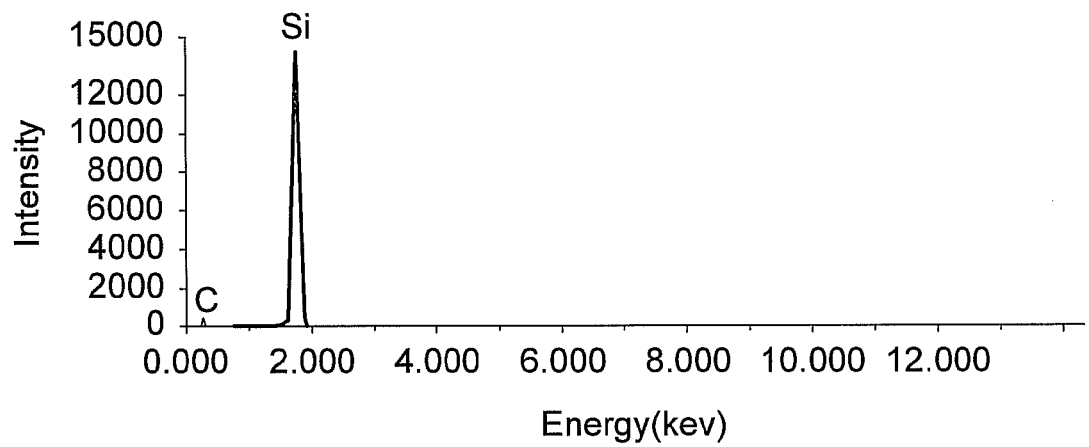
FIG. 6B is the EDX result of the pattern formed by the laser marking method of the embodiment.

In the embodiment, the surface analysis has also been conducted by EDX (Energy-dispersive X-ray spectroscopy) for analyzing the chemical composition of the wafer surface. Referring to FIG. 6A, the EDX result shows merely silicon (intensity of 80473 counts at energy of 1.752 key) being detected when the pattern is formed by a normal laser marking method. Referring to FIG. 6B, the EDX result shows not only silicon (intensity of 171472 counts at energy of 1.748 key) but also carbon (intensity of 679 counts at energy of 0.268 key) being detected when the pattern is formed by the laser marking method of the embodiment (as presented in FIG. 5A). Thus, the surface analysis result has proved that the components of the pattern on the wafer formed by the laser marking method of the embodiment at least include elements of silicon and carbon.

In the embodiment, different materials of the tape 26 have been applied to further investigate the adhesion of the patterns formed by the residuals. Four dicing tapes, including SPV-224S (available from Nitto), V-8A (available from Nitto), FS-353EP-110A (available from Furukawa) and D-676 (available from Adwill) are used in the related experiments, and the characteristics of those dicing tapes are listed in Table 1. In the embodiment, SPV-224S and V-8A are non-UV dicing tapes, which comprise polyvinyl chloride (PVC) as the base film. FS-353EP-110A and D-676 are UV dicing tapes, which comprise polyolefin (PO) as the base film.

TABLE 1

| | | SPV-224S (Nitto) | V-8A (Nitto) | FS-353EP-110A (Furukawa) | D-676 (Adwill) |
|---|---|---|---|---|---|
| Material type & Thickness (μm) | Base film | 65 PVC | 65 PVC | 100 PO | 80 PO |
| | Adhesive layer | 10 Acrylic layer | 10 Acrylic layer | 10 Acrylic layer | 10 Acrylic layer |
| | Total thickness | 75 | 75 | 110 | 90 |
| | Liner exist | No | Yes | Yes | Yes |
| Width (mm) | | 400 | 400 | 400 | 400 |
| Tape Type | | Non-UV | Non-UV | UV | UV |
| Tape Color | | Light blue | Light blue | Milky white | Milky white |
| Adhesion (mN/25 mm) | | 1960 | 1500 | 7500 | 2450 |

Several tests, including the legibility test, the tape test, the marking permanency test (MPT), the reflow test and the water clean test, are conducted to evaluate the laser marking pattern.

Figure 7:
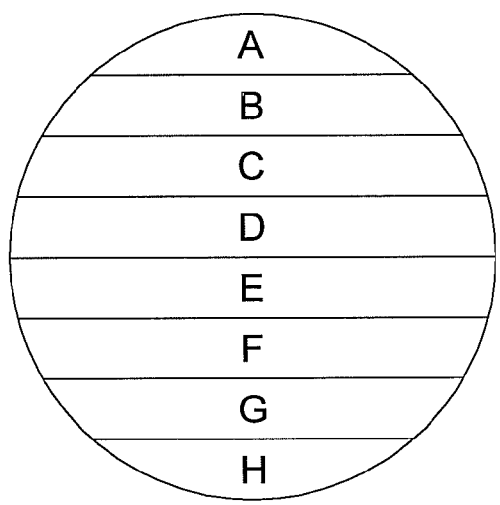
FIG. 7 illustrates a wafer divided into eight areas A~H for conducting the tests to evaluate the laser marking patterns.

Referring to FIG. 7, a wafer 20 is divided into eight areas A~H, and the laser marking patterns are formed using the laser power of 31.0A, 32.0A, 33.0A, 34.0A, 35.0A, 36.0A, 37.0A and 38.0A, respectively. Also, the ground wafer and the polished wafer (i.e. the second surface 203 of the wafer 20 being unpolished and polished) are applied in the experiments.

In the legibility test, the patterns formed by the residuals of the tapes on the ground wafer and the polished wafer are observed by an optical microscope (32×).

Table 2 lists the results of the patterns formed by the residuals of the Non-UV tapes (SPV-224S) of areas A~H on the ground wafer and the polished wafer. The results show that the patterns formed on the polished wafer are more clear and complete than on the ground wafer. The results also show that no pattern or hardly recognized pattern is formed on the ground wafer, and it is hypothesized that the rough surface or cracks of the ground wafer would cause the scattering effect when the laser marking is performed thereon.

Table 3 lists the results of the patterns formed by the residuals of the Non-UV tapes and the UV-tapes of areas A~H on the polished wafer. The results show that the patterns formed by the Non-UV tape are more clear and complete than by the UV tape. When the laser marking is performed, the UV tape absorbing the UV-light causes the decomposition and gasification of the adhesion layer of the UV tape so that the adhesion layer of the UV tape could not be tightly adhered to the wafer, thereby having considerable effect on the subsequent sewing process.

TABLE 2

| | Power (A) Cell | | | | | | | |
|---|---|---|---|---|---|---|---|---|
| | A | B | C | D | E | F | G | H |
| Wafer Type | 31 | 32 | 33 | 34 | 35 | 36 | 37 | 38 |
| Ground wafer | x | x | — | x | x | x | x | x |
| Polished wafer | good | good | good | good | good | SB | SB | SB |

"x" means no pattern on the ground wafer

"—" means hardly recognized pattern on the ground wafer

"SB" means clear but slightly blurred pattern on the ground wafer

TABLE 3

| | Power (A) Cell | | | | | | | |
|---|---|---|---|---|---|---|---|---|
| | A | B | C | D | E | F | G | H |
| Tape type | 31 | 32 | 33 | 34 | 35 | 36 | 37 | 38 |
| SPV-224S (Non-UV tape) | good | good | good | good | good | SB | SB | SB |
| FS-353EP-110A (UV tape) | good | good | good | good | SB | SB | SB | SB |
| D-676 (UV tape) | good | good | good | SB | SB | SB | SB | SB |
| V-8A (Non-UV tape) | good | good | good | good | good | SB | SB | SB |

"SB" means clear but slightly blurred pattern on the ground wafer

In the tape test, a special tape 3M-600 (available from 3M) is used to stick the patterns (such as marking words) formed by the residuals of the tapes on the ground wafer and the polished wafer, and then peel of to observe the adhesion of the patterns.

In the marking permanency test (MPT), three different solvents, including (solvents A, B and C, are used for testing if the patterns formed by the residuals of the tapes on the ground wafer and the polished wafer could be removed. Solvent A is a mixture of isopropyl alcohol, kerosene and ethylbenzene. Solvent B is a mixture of terpene groups. Solvent C is a mixture of pure water, propylene glycol monoethyl ether and monoethanolamine (MEA). The test results, listed in Table 4, have indicated that all of the patterns (including UV tapes and non-UV tapes) formed on the polished wafer and the patterns formed by tapes 353EP-110A (UV tape) and D-676 (UV tape) on the ground wafer pass the test.

In the reflow test, the patterns formed by the residuals of the tapes on the ground wafer and the polished wafer are reflowed at 255±7° C. (reflow model: FALCON-8500).

In the water clean test, the patterns formed by the residuals of the tapes on the ground wafer and the polished wafer are cleaned by water for about 30 minutes, to test if the patterns formed by the residuals of the tapes on the ground wafer and the polished wafer could be removed. The test results, listed in Table 4, have indicated that all of the patterns (including UV tapes and non-UV tapes) formed on the polished wafer and the patterns formed by tapes 353EP-110A (UV tape) and D-676 (UV tape) on the ground wafer pass the test.

The test results are summarized in Table 4.

TABLE 4

| Buyoff item | Non-UV tape SPV-224S | | UV tape FS-353EP-110A | | UV tape D-676 | | Non-UV tape V-8A | |
|---|---|---|---|---|---|---|---|---|
| | ground | polished | ground | polishd | ground | polished | ground | polished |
| Legibility | Fail | Pass | Pass | Pass | Pass | Pass | Fail | Pass |
| MPT | | Pass | Pass | Pass | Pass | Pass | | Pass |
| Water clean test | | Pass | Pass | Pass | Pass | Pass | | Pass |

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A wafer laser-marking method, comprising:
    providing a wafer having a first surface and a second surface opposite to each other, and the first surface having a plurality of bumps;
    thinning the wafer;
    fixing the thinned wafer on a non-UV tape such that and the second surface of the wafer is attached to the non-UV tape; and
    performing a laser marking step such that a laser light penetrates the tape and forms a pattern on the second surface of the wafer;
    wherein the step of fixing the thinned wafer further comprises:
    providing a frame on which the non-UV tape is disposed;
    attaching the second surface of the wafer on the non-UV tape to fix the thinned wafer; and
    setting a ring on the periphery of the non-UV tape, wherein the ring and the frame are positioned on the opposite sides of the non-UV tape, and the periphery of the non-UV tape is flatly unfolded on the frame to form a flat surface attached to the second surface of the wafer.

2. The method according to claim 1, wherein the pattern is formed by leaving the residuals of the non-UV tape on the second surface of the wafer.

3. The method according to claim 2, wherein the pattern formed by the residuals of the non-UV tape is projected from the second surface of the wafer.

4. The method according to claim 1, wherein the second surface of the wafer is a polished surface.

5. The method according to claim 1, wherein the non-UV tape comprises a base film and an adhesive layer on one side of the base film.

6. The method according to claim 1, wherein the base film is one of polyvinyl chloride (PVC) film, polyolefin (PO) and Polyethylene (PE), and the adhesive layer comprises acrylic polymer.

7. The method according to claim 1, further comprises attaching an adhesive layer on the first surface of the wafer before thinning the wafer, and removing the adhesive layer after thinning the wafer.

8. The method according to claim 1, wherein the step of thinning the wafer is achieved by grinding the second surface of the wafer.

9. The method according to claim 1 wherein the frame and the non-UV tape are applicable to a laser apparatus and a wafer cutting apparatus.

10. The method according to claim 1, wherein the frame is a circular frame, and the non-UV tape is a round tape.

11. The method according to claim 1, wherein after the laser marking step, the method further comprises cutting the wafer to form a plurality of separate dies attached on the non-UV tape.

* * * * *